(12) United States Patent
Beauchamp et al.

(10) Patent No.: US 7,157,790 B2
(45) Date of Patent: Jan. 2, 2007

(54) SINGLE DIE STITCH BONDING

(75) Inventors: Bruce Beauchamp, Gilbert, AZ (US);
Andrew Tuthill, Te Puke (NZ); Joseph D. Fernandez, Nonthaburi (TH);
Anucha Phongsantichai, Bangkok (TH)

(73) Assignee: Microchip Technology Inc., Chandler, AZ (US)

( * ) Notice: Subject to any disclaimer, the term of this patent is extended or adjusted under 35 U.S.C. 154(b) by 473 days.

(21) Appl. No.: 10/209,502

(22) Filed: Jul. 31, 2002

(65) Prior Publication Data
US 2004/0021192 A1 Feb. 5, 2004

(51) Int. Cl.
*H01L 31/00* (2006.01)

(52) U.S. Cl. ............... 257/673; 257/672; 257/459; 257/676; 257/735; 257/E23.024; 438/123

(58) Field of Classification Search ......... 257/459, 257/673, 674, 676, 734, 735, 738, 779, 780, 257/782, 784, 786, 666, 672, E23.024; 438/123
See application file for complete search history.

(56) References Cited

U.S. PATENT DOCUMENTS

| | | | | |
|---|---|---|---|---|
| 4,987,475 A | * | 1/1991 | Schlesinger et al. | 257/666 |
| 5,252,853 A | * | 10/1993 | Michii | 257/666 |
| 5,254,501 A | * | 10/1993 | Tung et al. | 29/827 |
| 5,502,289 A | | 3/1996 | Takiar et al. | 174/266 |
| 5,552,966 A | * | 9/1996 | Nagano | 361/813 |
| 5,646,451 A | * | 7/1997 | Freyman et al. | 257/784 |
| 5,814,881 A | | 9/1998 | Alagaratnam et al. | 257/686 |
| 5,818,114 A | * | 10/1998 | Pendse et al. | 257/786 |
| 5,838,072 A | * | 11/1998 | Li et al. | 257/786 |
| 5,886,393 A | * | 3/1999 | Merrill et al. | 257/531 |
| 5,903,443 A | * | 5/1999 | Schoenfeld et al. | 361/813 |
| 6,008,533 A | * | 12/1999 | Bruce et al. | 257/691 |
| 6,051,887 A | | 4/2000 | Hubbard | 257/777 |
| 6,133,637 A | | 10/2000 | Hikita et al. | 257/777 |
| 6,169,329 B1 | * | 1/2001 | Farnworth et al. | 257/780 |

(Continued)

FOREIGN PATENT DOCUMENTS

JP 60-1968 * 8/1985

OTHER PUBLICATIONS

Otter, Chris: "Wirebonding in microelectronics", http://www.twi.co.uk/j32k/protected/band_3/kscco001.html, 5 pages, Feb. 2001.
Chapter A: Wire Bonding, Level 2. Conclusions and guidline, Wirebonding techniques; 16 pages, no date.

*Primary Examiner*—Eugene Lee
(74) *Attorney, Agent, or Firm*—Baker Botts L.L.P.

(57) ABSTRACT

An integrated circuit device comprising an integrated circuit die mounted on a leadframe having a plurality of inner leads. The integrated circuit die has a plurality of bond pads that are electrically connected to the inner leads of the leadframe, wherein at least two bond pads are connected to a one of the plurality of inner leads and/or at least two inner leads are connected to one or more bond pads with a single bond wire. A single bond wire is connected to a first bond pad or inner lead and subsequently wedge or stitch bonded to a second bond pad or inner lead, then it is connected to a third bond pad or inner lead. The single bond wire requires only one connection area at each of the bond pad(s) and inner lead(s). The bond pad(s) of the die and inner lead(s) of the leadframe are thereby electrically connected together by the single bond wire.

14 Claims, 6 Drawing Sheets

U.S. PATENT DOCUMENTS

| | | | |
|---|---|---|---|
| 6,208,579 B1 * | 3/2001 | Prutchi et al. | 365/230.01 |
| 6,291,894 B1 * | 9/2001 | Farnworth et al. | 257/780 |
| 6,320,259 B1 | 11/2001 | Yamauchi et al. | 257/734 |
| 6,326,235 B1 * | 12/2001 | Glenn | 438/106 |
| 6,376,909 B1 | 4/2002 | Forbes et al. | 257/734 |
| 6,380,635 B1 * | 4/2002 | Manning et al. | 257/784 |
| 6,406,943 B1 * | 6/2002 | Corisis | 438/123 |
| 6,407,456 B1 | 6/2002 | Ball | 257/777 |
| 6,476,506 B1 * | 11/2002 | O'Connor et al. | 257/786 |
| 6,506,625 B1 * | 1/2003 | Moden | 438/107 |
| 6,603,072 B1 * | 8/2003 | Foster et al. | 174/52.4 |
| 6,608,368 B1 * | 8/2003 | Ohashi | 257/668 |
| 6,674,177 B1 * | 1/2004 | Schoenfeld | 257/784 |
| 2001/0023994 A1 | 9/2001 | Oka | |
| 2002/0058357 A1 | 5/2002 | Oka | |
| 2002/0060380 A1 | 5/2002 | Uner et al. | |

* cited by examiner

US 7,157,790 B2

SINGLE DIE STITCH BONDING

RELATED PATENT APPLICATION

This application is related to commonly owned U.S. patent application Ser. No. 09/832,287, entitled "Arrangement and Method of Arrangement of Stacked Dice in an Integrated Electronic Device" by Joseph Fernandez, filed Apr. 10, 2001, and is hereby incorporated by reference herein for all purposes.

FIELD OF THE INVENTION

The present invention is related to connecting to integrated circuit bond pads, and more particularly to connecting related bond pads by stitch bonding a continuous bond wire thereto.

BACKGROUND OF THE INVENTION TECHNOLOGY

An Integrated circuit device may comprise an semiconductor integrated circuit die mounted on a leadframe. The semiconductor integrated circuit die comprises a plurality of bond pads that are electrically connected to inner leads of the leadframe, e.g., using bond wires. The semiconductor integrated circuit die, the inner portion of the leadframe (inner leads) and the bond wires may be encapsulated into an integrated circuit package. After encapsulation, a border or frame on the outer portion of the leadframe is cut to separate outer leads of the leadframe into connecting pins or surface mount contacts which are used to electrically connect the electronic circuitry in the semiconductor integrated circuit die with other externally arranged electronic components mounted on a substrate or printed circuit board.

Integrated circuit devices are becoming more and more sophisticated while integrated circuit package size and the number of available package connections are being reduced. Limiting the number of package connections available for connecting to device circuits is necessary for both size and cost constraints. However, this may create a problem for the integrated circuit device manufacturer who must offer integrated circuit devices for many different types of configurations and applications. Integrated circuit device cost is reduced when a large quantity of the same device is produced. It is relatively easy to fabricate an integrated circuit device capable of many different configurations and uses than to have to perform various different metal mask operations so as to fabricate differently configured integrated circuit devices. A specific device configuration may then be selected during fabrication of the integrated circuit device with the leadframe by appropriate jumper connections between the die bond pads and inner lead fingers of the leadframe. Typically, various combinations of die bond pads are connected together through common connections to an inner lead(s) of the leadframe. However selecting a specific configuration in this fashion for configuration of the integrated circuit device becomes problematic when the reduced die, package and leadframe areas available for interconnecting option selection pads of the integrated circuit die are reduced. Making more than one wire bond connection to a die bond pad and/or inner lead of a leadframe may not be practical or even possible in the smaller and more densely packaged integrated circuits.

Therefore, there is a need for connecting a plurality of integrated circuit bond pads and/or inner leads of a leadframe together without requiring multiple connections thereto.

SUMMARY OF THE INVENTION

The present invention overcomes the above-identified problems as well as other shortcomings and deficiencies of existing technologies by providing multiple common connections in an integrated device while requiring only a single connection point at each of the commonly connected integrated circuit die bond pads and/or inner leads of a leadframe. A single wire is stitch or wedge bonded between one or more die bond pads and one or more inner leads of a leadframe to create a common connection therebetween.

According to an exemplary embodiment of the invention, an integrated device comprising an integrated circuit die having bond pads and a leadframe having a plurality of inner leads may have multiple common connections between one or more of the die bond pads and one or more of the inner leads of the leadframe. A single bond wire is wedge or stitch bonded to each of the one or more die bond pads and one or more inner leads of a leadframe that are desired to be commonly connected while requiring only a single attachment point at each of these one or more die bond pads and these one or more inner leads.

A technical advantage of the present invention is using a single wire stitch bond to create a common interconnection between one or more die bond pads and/or one or more inner leads of a leadframe. Another technical advantage is requiring only a single stitch bond wire to set device configuration. Still another technical advantage is a needing only a single point of connection to a die bond pad and/or inner lead of a leadframe for multiple common interconnections of one or more die bond pads and/or one or more inner leads of a leadframe. Yet another technical advantage is reducing the number of different metal mask configurations required for selecting device operating modes.

A feature of the present invention is the ability to add options to the integrated circuit package after wafer fabrication. Another feature is setting device mode options after wafer fabrication. Yet another feature is using only one connection point at each bond pad and inner lead of a leadframe.

BRIEF DESCRIPTION OF THE DRAWINGS

Features and advantages of the invention will be apparent from the following description of presently preferred embodiments, given for the purpose of disclosure and taken in conjunction with the accompanying drawings wherein.

Figure 1:
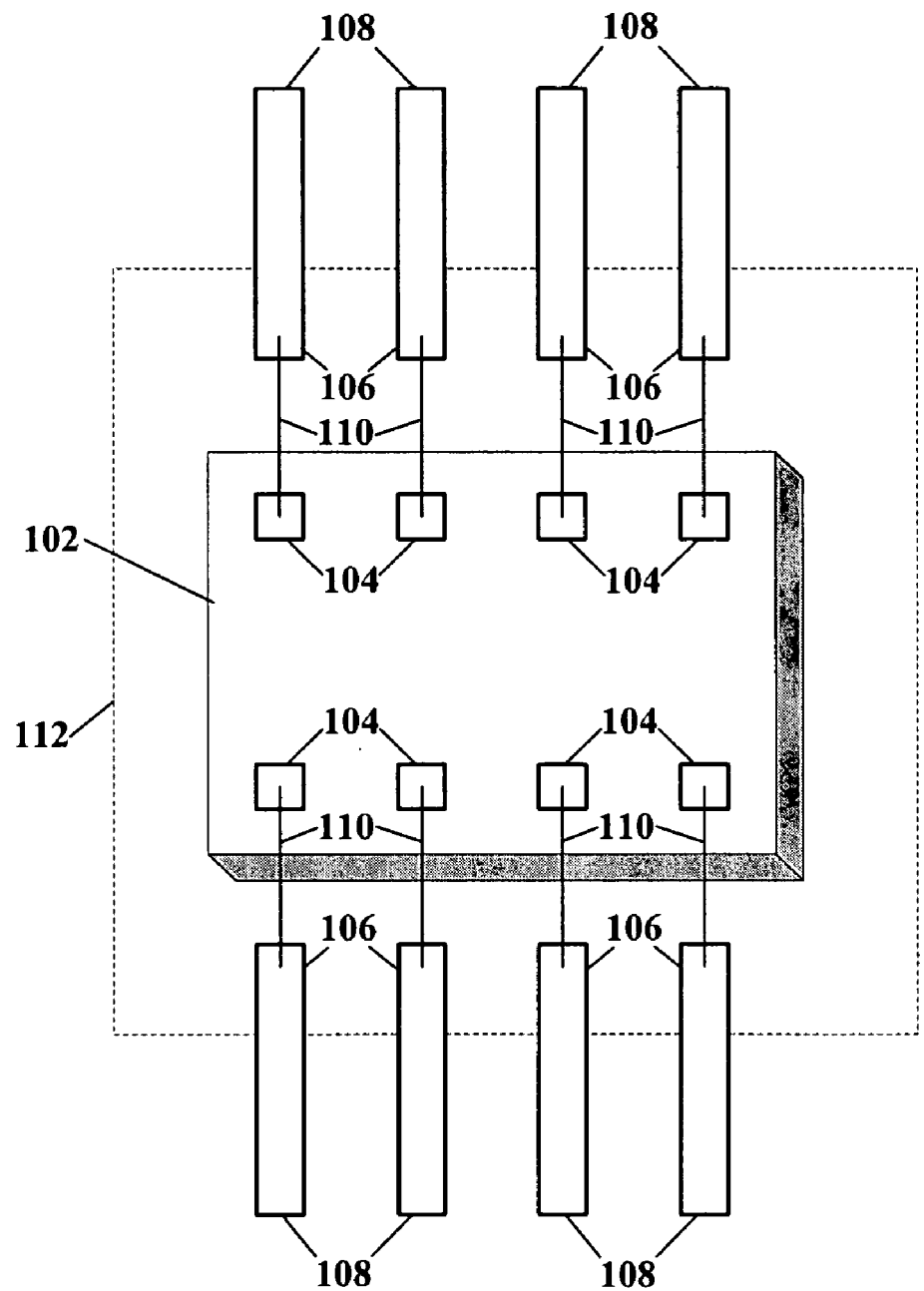
FIG. 1 is a plan view of a prior art integrated circuit die having bond pads thereon connected with bond wires to respective ones of inner leads of a leadframe.

While the present invention is susceptible to various modifications and alternative forms, specific exemplary embodiments thereof have been shown by way of example in the drawing and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The present invention provides multiple common connections in an integrated device while requiring only a single connection point at each of the commonly connected integrated circuit die bond pads and/or inner leads of a leadframe. A multiple common connection is provided by using a single bond wire which is stitch or wedge bonded to a single point at each die bond pad and inner lead of the leadframe that are commonly connected together.

Referring now to the drawings, the details of exemplary embodiments of the present invention are schematically illustrated. Like elements in the drawings will be represented by like numbers, and similar elements will be represented by like numbers with a different lower case letter suffix.

The term "wirebonding" is generally accepted to mean the interconnection (via wire) of components, contact pads and conducting tracks. There are two basic wirebonding techniques that may be used in thermocompression (T/C), thermosonic (T/S) or ultrasonic (U/S) bonding processes, they are ball bonding and wedge bonding. Referring to FIG. 1, in ball bonding a wire, e.g., bond wire 110, is passed through a hollow capillary tool (not shown) and a small portion of the end of this wire is heated to a molten condition wherein the surface tension of the molten metal forms a spherical shape, or ball, as the bond wire material solidifies. The ball at the end of the wire is pressed onto a bond pad 104 of the semiconductor die 102 with sufficient force to cause plastic deformation and atomic interdiffusion of the ball and the underlying metallization of the bond pad 104. This creates a low resistance connection between the bond pad 104 and the ball at the end of the wire.

The capillary tool containing the wire is then raised and repositioned over the next connection point, e.g., inner lead 106 of the leadframe. A precisely shaped wire connection called a wire loop is thus created. Deforming the wire against the inner lead 106 makes the second bond (e.g., wedge bond or stitch bond). The deformation of the wire against the inner lead 106 may have a crescent or fishtail shape made by the imprint of the capillary tool's outer geometry. After this second connection is made, the wire is clamped and then broken off after the bond connection.

Wedge bonding derives its name from the shape of the bonding capillary tool. In wedge bonding, the wire is fed at an angle from about 30–60 degrees from the horizontal bonding surface through a hole in the back of a bonding wedge of the capillary tool. Normally, forward bonding is preferred, i.e., the first bond is made to the die bond pad 104 and the second bond is made to the inner lead 106 of the leadframe. After the first bond operation, the wedge bonding capillary tool rises and executes a motion to create a desired wire loop shape (bond wire). At the second bond location, the wedge bonding capillary tool descends and makes the second bond connection. The movement of the axis of the wedge bonding capillary tool allows the wire to freely feed through the hole in the wedge bonding capillary tool. The bonded wire may be separated from the wire remaining in the wedge bonding capillary tool by using clamps to break the wire while machine bonding force is maintained on the second bond (clamp tear), or the clamp remains stationary and the wedge bonding capillary tool raises off the second bond area to tear the wire apart (table tear).

The wire is made of a conductive material such as metal, e.g., gold, copper, aluminum, combinations of these metals (alloys), or alloys of these metals in combination with other metals, e.g., Silicon (Si) and/or magnesium (Mg). The bonding surfaces may be coated or plated with a compatible conductive material, e.g., gold, aluminum, gold, or nickel, etc. It is contemplated and within the scope of the present invention that any type of conductive material, e.g., metal or metal alloy is within the scope of the present invention.

FIG. 1 depicts is a plan view of a prior art integrated circuit die having bond pads thereon connected with bond wires to respective ones of inner leads of a leadframe. The integrated circuit die is represented by the numeral 102 and has a plurality of bond pads 104 thereon. The bond pads 104 are connected to the electronic circuits (not shown) comprising the die 102. A leadframe (not entirely shown, but well known to those skilled in the art of integrated circuits) comprises a plurality of inner leads 106, a plurality of outer leads 108 and a support structure or "die paddle" (not shown). The die 102 is initially supported by the leadframe die paddle. The outer leads 108 may be formed into connecting pins or surface mount contacts as desired. Bond wires 110 electrically connect the bond pads 104 to respective ones of the inner leads 106. The die 102 and supporting die paddle, bond pads 104, inner leads 106 and bond wires 110 may be encapsulated in an integrated circuit package, schematically depicted by the outline referenced by the numeral 112.

Figure 2:
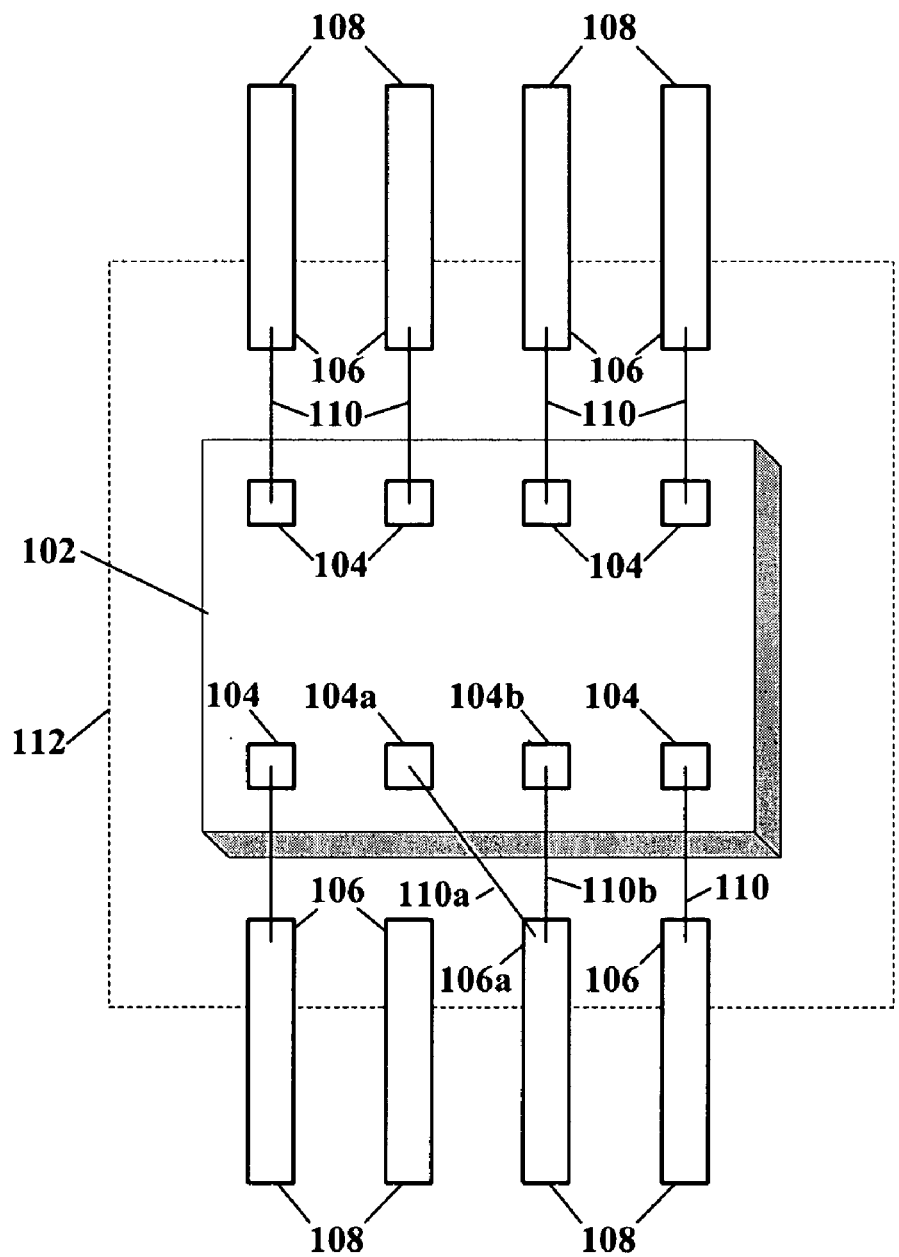
FIG. 2 is a plan view of a prior art integrated circuit die having two bond pads thereon connected with two bond wires to a common inner lead of a leadframe.

Referring to FIG. 2, depicted is a plan view of a prior art integrated circuit die having two bond pads thereon connected with two bond wires to a common inner lead of a leadframe. Two bond wires 110a and 110b are attached to the inner lead 106a and thereby electrically interconnect bond pad 104a, bond pad 104b and the inner lead 106a together. A problem exists however in that the inner lead 106a must have sufficient free bonding area to accommodate two bond wire connections. When more than two interconnections are required, this bonding area problem is further exasperated. As semiconductor integrated circuit devices become smaller and more complex, there may not be sufficient bonding area on an inner lead or bond pad to accommodate more than one bond wire connection.

Figure 3:
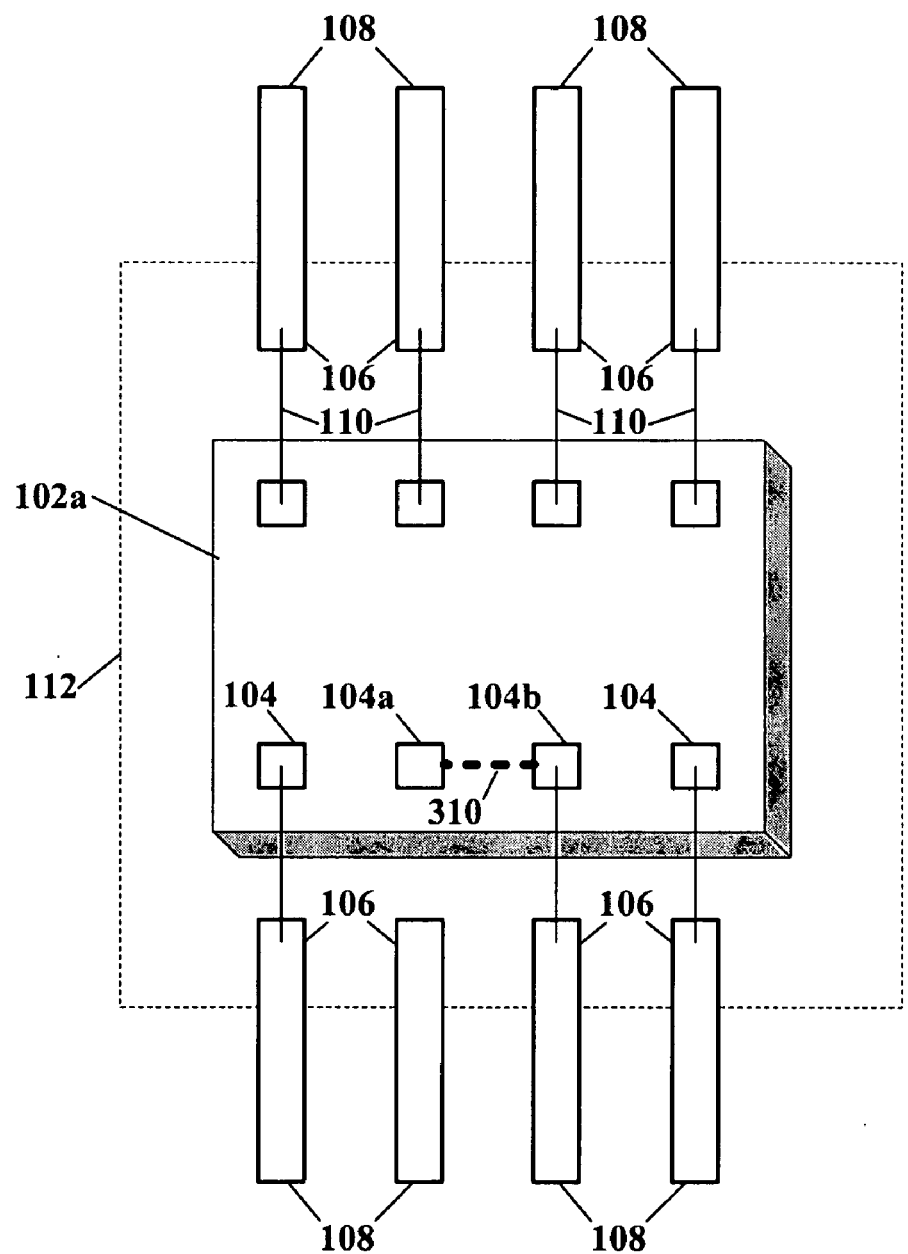
FIG. 3 is a plan view of a prior art integrated circuit die having two bond pads thereon connected with an internal metal mask jumper.

Referring to FIG. 3, depicted is a plan view of a prior art integrated circuit die having two bond pads thereon connected with an internal metal mask jumper. During fabrication of the semiconductor integrated circuit die 102a, a conductive jumper 310 may be created during a metallization step in the die fabrication process so as to interconnect, for example, bond pads 104a and 104b. The jumper 310 may be used to configure or set options within the die 102a, however, different metallization masks and batch runs must be performed during the integrated circuit die fabrication process to achieve these different integrated circuit options. Thus, a using mask jumper(s) 310 is not cost effective for a small quantity of semiconductor devices. In addition, a greater parts inventory is required when using mask jumpers since larger quantities of each semiconductor die configuration must be fabricated in order to be cost effective.

Figure 4:
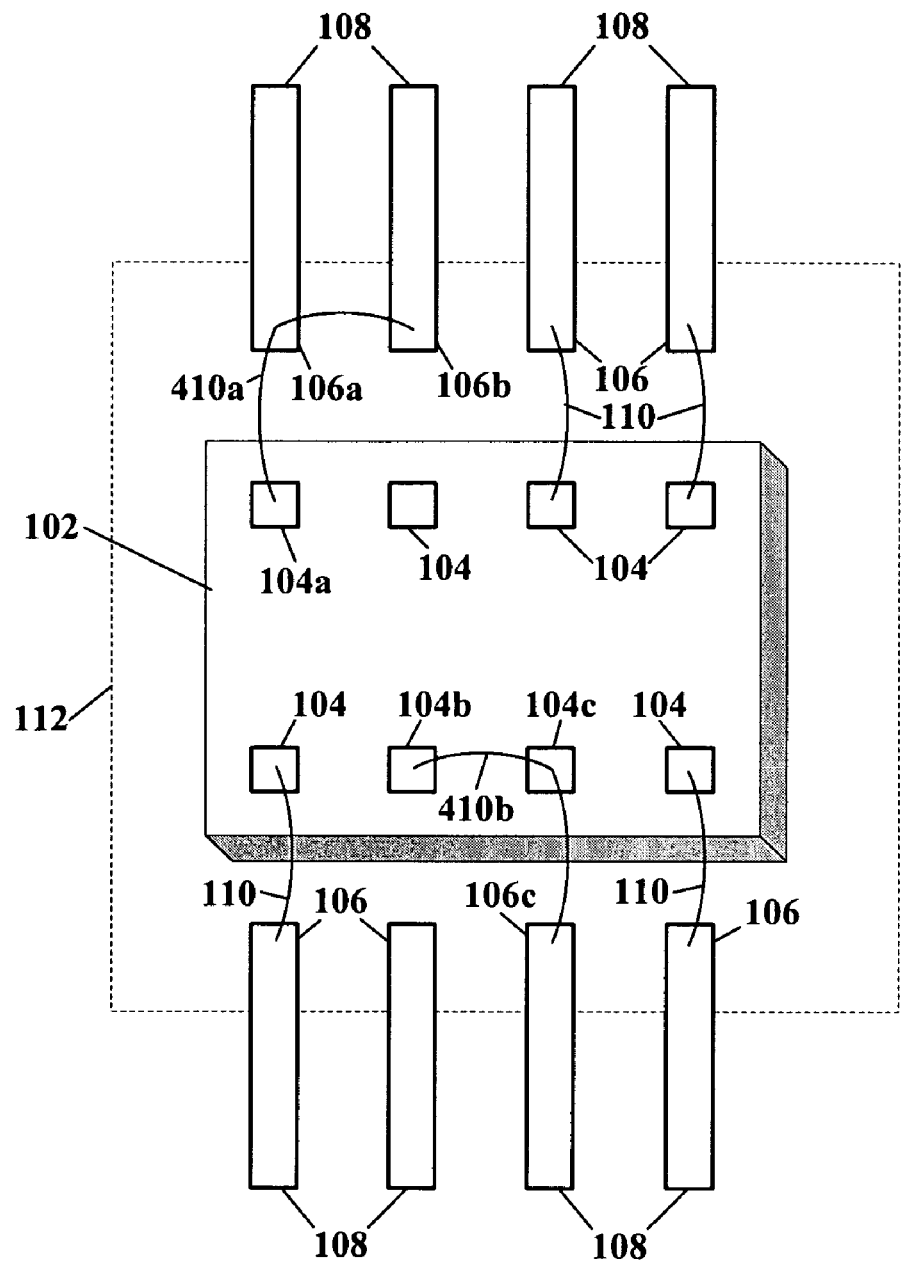
FIG. 4 is a plan view of an integrated circuit die having two bond pads and an inner lead of a leadframe connected together with a single stitch bond connected bond wire, and two other inner leads of the leadframe connected to another bond pad with another single stitch bond connected bond wire, according to exemplary embodiments of the present invention.

Referring now to FIG. 4, depicted is a plan view of an integrated circuit die having two bond pads and an inner lead of a leadframe connected together with a single stitch bond connected bond wire, and two other inner leads of the leadframe connected to another bond pad with another single stitch bond connected bond wire, according to exemplary embodiments of the present invention. A single bond wire 410a connects bond pad 104a, inner lead 106a and inner lead 106b together and requires only one bond point a each connection area of the bond pad 104a, inner lead 106a and inner lead 106b. A ball or wedge bond connection may be used at the first connection point of the bond wire 410a, and subsequent connection points may use wedge (stitch) bonding. The bond wire 410a remains unbroken (continuous) until the last connection has been made. The first connection of the bond wire 410a may begin at either bond pad 104a or inner lead 106b. Preferably, the first connection will be at the bond pad 104a. The intermediate connection at the inner lead 106a will be a wedge (stitch) bond wherein the bond wire 410a remains unbroken. For example, a simple interconnection operation may be performed as follows. First, the capillary tool bonds the bond wire 410a to the bond pad 104a of the die 102, then the capillary tool moves to the inner lead 106a. A wedge (stitch) bond is made to the inner lead 106a, and then the capillary tool moves to the inner lead 106b and bonds the bond wire 410a thereto. In a similar fashion, bond wire 410b may interconnect bond pad 104b, bond pad 104c and inner lead 106c together.

Figure 5:
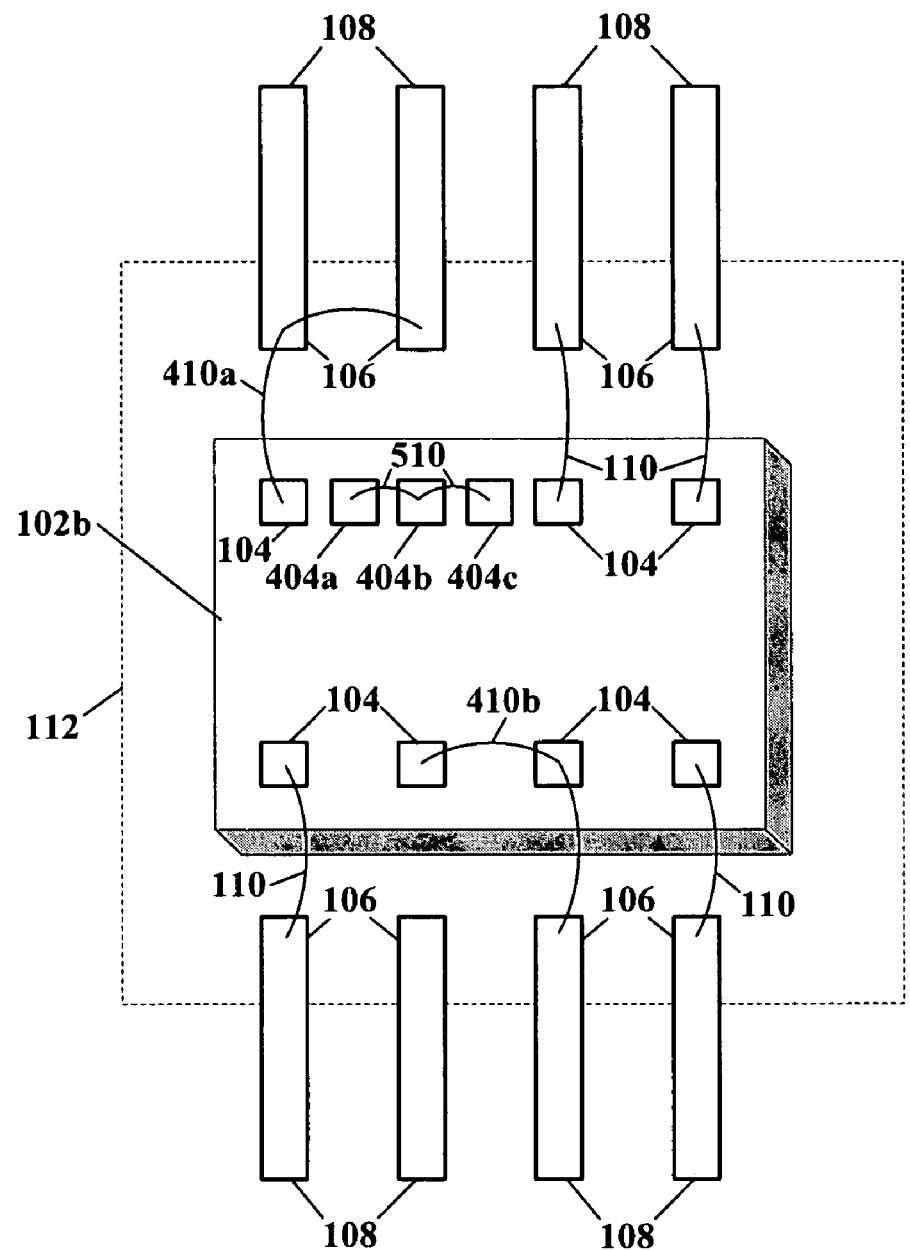
FIG. 5 is a plan view of the integrated circuit die illustrated in FIG. 4 with the addition of a device mode selection jumper commonly connecting mode option selection bond pads on the die, according to another exemplary embodiment of the present invention.

Referring now to FIG. 5, depicted is a plan view of the integrated circuit die illustrated in FIG. 4 with the addition of a device mode selection jumper commonly connecting mode option selection bond pads on the die, according to another exemplary embodiment of the present invention. Bond pads 404a, 404b and 404c are exemplary and may be greater or fewer in number depending upon the application and number of operational modes that may be selected for the semiconductor integrated circuit die 102b. A stitch bonded jumper bond wire 510 may connect bond pads 404a, 404b and 404c together. When a different option or die configuration is desired, the bond pads 404a, 404b and 404c may be interconnected or left unconnected as required.

Figure 6:
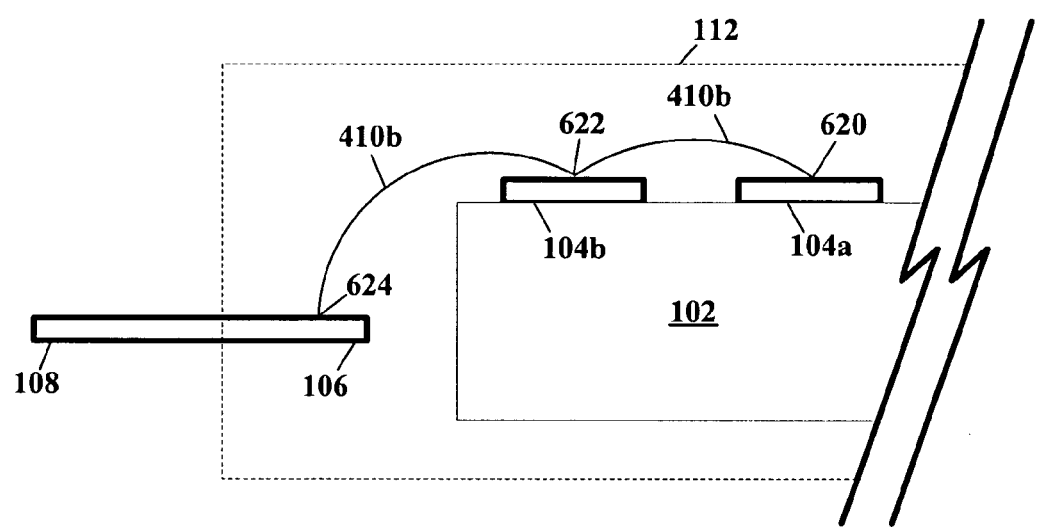
FIG. 6 is an elevational view of a single stitch bond connected bond wire, according to the exemplary embodiments of the present invention.

FIG. 6 is an elevational view of a single stitch bond connected bond wire, according to the exemplary embodiments of the present invention. The first connection of the bond wire 410b may begin at either bond pad 104a or inner lead 106. Preferably, the first connection will be at the bond pad 104a. A connection to bond pad 104b is made by stitch bonding the bond wire 410b which remains unbroken or continuous until bonded to the inner lead 106. After the bond wire 410b has been bonded to the inner lead 106, it is separated from the wire at the tip of the capillary tool, thus completing the stitch bond.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention Consequently, the invention is intended to be limited only by the spirit and scope of the appended claims, giving fill cognizance to equivalents in all respects.

What is claimed is:

1. An integrated circuit device, comprising:
    a leadframe having a plurality of inner leads;
    an integrated circuit die having a plurality of bond pads; and
    a single bond wire electrically coupling together at least one of the plurality of bond pads and at least two of the plurality of inner leads, wherein the single bond wire makes a first connection to a one of the at least one of the plurality of bond pads and a last connection to a one of the at least two of the plurality of inner leads such that the single bond wire is connected only once to each of the at least one of the plurality of bond pads and each of the at least two of the plurality of inner leads.

2. The integrated circuit device of claim 1, wherein first connection of the single bond wire is made with a ball bond and subsequent connections are made with wedge bonds.

3. The integrated circuit device of claim 1, wherein the first and subsequent connections of the single bond wire are made with wedge bonds.

4. The integrated circuit device of claim 1, further comprising an integrated circuit package encapsulating the plurality of inner leads of the leadframe, the integrated circuit die, the plurality of bond pads and the single bond wire.

5. A method of making electrical connections between an integrated circuit die and a leadframe with a single bond wire, said method comprising the steps of:
    providing a leadframe having a plurality of inner leads;
    providing an integrated circuit die having a plurality of bond pads;
    providing a single bond wire; and
    coupling together at least one of the plurality of bond pads and at least two of the plurality of inner leads with the single bond wire, wherein the single bond wire makes a first connection to a one of the at least one of the plurality of bond pads and a last connection to a one of the at least two of the plurality of inner leads such that the single bond wire is connected only once to each of the at least one of the plurality of bond pads and each of the at least two of the plurality of inner leads.

6. The method of claim 5, wherein the step of coupling comprises the steps of:
    making the first connection with a ball bond; and
    making subsequent connections with wedge bonds.

7. The method of claim 5, wherein the step of coupling comprises the steps of making wedge bond connections with the single bond wire to the at least one of the plurality of bond pads and to each of the at least two of the plurality of inner leads.

8. An integrated circuit device, comprising:
    a leadframe having a plurality of inner leads;
    an integrated circuit die having a plurality of bond pads; and
    a single bond wire electrically coupling together at least one of the plurality of bond pads and at least two of the plurality of inner leads, wherein the single bond wire makes a first connection to a one of the atleast two of the plurality of inner leads and a last connection to a one of the at least one of the plurality of bond pads such that the single bond wire is connected only once to each of the at least one of the plurality of bond pads and each of the at least two of the plurality of inner leads.

9. The integrated circuit device of claim 8, wherein the first connection of the single bond wire is made with a ball bond and subsequent connections are made with wedge bonds.

10. The integrated circuit device of claim 8, wherein the first and subsequent connections of the single bond wire are made with wedge bonds.

11. The integrated circuit device of claim 8, further comprising an integrated circuit package encapsulating the plurality of inner leads of the leadframe, the integrated circuit die, the plurality of bond pads and the single bond wire.

12. A method of making electrical connections between an integrated circuit die and a leadframe with a single bond wire, said method comprising the steps of:
    providing a leadframe having a plurality of inner leads;
    providing an integrated circuit die having a plurality of bond pads;
    providing a single bond wire; and
    coupling together at least one of the plurality of bond pads and at least two of the plurality of inner leads with the single bond wire, wherein the single bond wire makes a first connection to a one of the at least two of the plurality of inner leads and a last connection to a one of the at least one of the plurality of bond pads such that the single bond wire is connected only once to each of the at least one of the plurality of bond pads and each of the at least two of the plurality of inner leads.

13. The method of claim 12, wherein the step of coupling comprises the steps of:
    making the first connection with a ball bond; and
    making subsequent connections with wedge bonds.

14. The method of claim 12, wherein the step of coupling comprises the steps of making wedge bond connections with the single bond wire to the at least one of the plurality of bond pads and to each of the at least two of the plurality of inner leads.

\* \* \* \* \*